US010559953B2

(12) United States Patent
Hillis et al.

(10) Patent No.: US 10,559,953 B2
(45) Date of Patent: Feb. 11, 2020

(54) REDUNDANT AND FAULT-TOLERANT POWER DISTRIBUTION SYSTEM HAVING AN INTEGRATED COMMUNICATION NETWORK

(71) Applicant: Applied Invention, LLC, Burbank, CA (US)

(72) Inventors: W. Daniel Hillis, Encino, CA (US); Anthony N. Gardner, Las Vegas, NV (US); Russel Howe, Montrose, CA (US); Randall Adam Yates, Ventura, CA (US)

(73) Assignee: Applied Invention, LLC, Burbank, CA (US)

( * ) Notice: Subject to any disclaimer, the term of this patent is extended or adjusted under 35 U.S.C. 154(b) by 0 days.

(21) Appl. No.: 16/151,249

(22) Filed: Oct. 3, 2018

(65) Prior Publication Data
US 2019/0036323 A1    Jan. 31, 2019

Related U.S. Application Data

(63) Continuation of application No. 13/677,108, filed on Nov. 14, 2012, now Pat. No. 10,096,987, which is a
(Continued)

(51) Int. Cl.
*G01R 31/00* (2006.01)
*H02H 7/26* (2006.01)
(Continued)

(52) U.S. Cl.
CPC ............ *H02H 3/08* (2013.01); *G01R 31/007* (2013.01); *H02H 3/38* (2013.01); *H02H 7/261* (2013.01)

(58) Field of Classification Search
CPC ........ G01R 31/007; H02H 7/261; H02H 3/08; H02H 3/38
See application file for complete search history.

(56) References Cited

U.S. PATENT DOCUMENTS

| 4,804,938 A | 2/1989 | Rouse et al. |
| 6,678,829 B1 | 1/2004 | Teggatz et al. |

(Continued)

OTHER PUBLICATIONS

Ralph E. Fehr, "An integrated optimal design method for utility power distribution systems", Univ S. Fla PhD Thesis 2005 (Year: 2005).*

(Continued)

*Primary Examiner* — Regis J Betsch
(74) *Attorney, Agent, or Firm* — Michael A. Glenn; Perkins Coie LLP (57) ABSTRACT

A power distribution and communication system includes nodes connected by power lines and communication links. The system receives power from one or more power sources. Each node contains at least one power port, data port and load port. Associated with each power port and load port is a port monitor for measuring current flowing into or out of the port and the voltage difference between the port outlet and ground, which measurements are passed to a processing element. The processing element and monitor analyze measured values to detect fault conditions. Upon fault condition detection, the port is disabled by opening a switch, disconnecting the port from the system voltage. The processing element receives power directly from the power line, thus receiving power from a live power line even if the associated power port is disabled allowing the processing element to enable a disabled node following a failure.

30 Claims, 4 Drawing Sheets

Related U.S. Application Data continuation of application No. 12/548,724, filed on Aug. 27, 2009, now Pat. No. 8,326,552.

(60) Provisional application No. 61/092,690, filed on Aug. 28, 2008.

(51) Int. Cl.
*H02H 3/08* (2006.01)
*H02H 3/38* (2006.01)

(56) References Cited

U.S. PATENT DOCUMENTS

| | | | |
|---|---|---|---|
| 7,184,903 | B1 | 2/2007 | Williams et al. |
| 2002/0064010 | A1 | 5/2002 | Nelson et al. |
| 2004/0130292 | A1 | 7/2004 | Buchanan et al. |
| 2005/0251296 | A1* | 11/2005 | Tracy Nelson ........ G06Q 10/06 700/292 |
| 2006/0080573 | A1* | 4/2006 | Biederman ............. H04L 12/10 714/11 |
| 2007/0271006 | A1* | 11/2007 | Golden ................... H02J 3/14 700/295 |
| 2007/0285857 | A1 | 12/2007 | Berkowitz et al. |
| 2008/0225452 | A1 | 9/2008 | Stoupis et al. |
| 2009/0027932 | A1 | 1/2009 | Haines et al. |

OTHER PUBLICATIONS

Robert Hammett, "Fault-Tolerant Input/Output [I/O] Networks Applied to Ship Control", Proceedings of the 12th Ship Control Systems held in the Hague, Netherlands, Oct. 10-21, 1999 (Year: 1999).*

* cited by examiner

REDUNDANT AND FAULT-TOLERANT POWER DISTRIBUTION SYSTEM HAVING AN INTEGRATED COMMUNICATION NETWORK

CROSS REFERENCE TO RELATED APPLICATIONS

This Application is a continuation of U.S. application Ser. No. 13/677,108, filed 14 Nov. 2012, which is a continuation of U.S. application Ser. No. 12/548,724, filed 27 Aug. 2009, which was issued as U.S. Pat. No. 8,326,552 on 4 Dec. 2012, which claims priority to U.S. Provisional Application No. 61/092,690, filed 28 Aug. 2008, which are each incorporated herein in its entirety by this reference thereto.

BACKGROUND OF THE INVENTION

Technical Field

The invention generally relates to power distribution systems and communication networks. More particularly, the invention relates to a redundant and fault-tolerant combined power distribution system and communication network.

Background Description

A primary objective for any power distribution system or communication network is to minimize the likelihood of a loss of function in the event of a failure. While strategic routing and shielding of physically durable wiring can minimize the likelihood of a failure, fault tolerant systems are clearly advantageous if functionality is to be preserved when a failure (inevitably) occurs.

Power distribution systems and communication networks are subject to a wide variety of failure conditions, but primary among these are:

Break: a complete severing of the wire carrying the power or communications signal;

Full Short: a low-resistance, non-intermittent connection either to ground (in the case of a power distribution system) or to ground or between a differential pair (in the case of a communication network);

Partial Short: a relatively high-resistance or intermittent connection either to ground (in the case of a power distribution system) or to ground or between a differential pair (in the case of a communication network).

In the case of a conventional power distribution system, a break results in a loss of power to all devices "downstream" of the cut. Similarly, a full short removes power from downstream devices, and may additionally damage devices with inadequate current overload protection. A partial short can cease device function, lead to erratic device function, or damage one or more devices.

The importance of addressing such failures is increasing with the more frequent deployment of higher voltage power distribution systems, such as the move from 12- to 42-volt vehicle power distribution systems. For example, a higher voltage system is much more likely to support an arc between exposed wiring and the vehicle chassis, creating a short to ground. Similarly, an increased hazard is presented by in-line arcs across severed wires which are carrying current.

In the case of a communications network, such as a conventional Controller Area Network (CAN-bus), a break separates the bus into two improperly terminated segments. Communication between devices on opposing sides of the cut is no longer possible. Reflection associated with the improper termination may even inhibit communication between devices within one segment. A full short, either to ground or between a differential pair, effectively pulls the logic values to zero, rendering all communication on the bus impossible. A partial short also renders communication problematic if not impossible, and may even result in the introduction of spurious data.

SUMMARY

A power distribution and communication system includes nodes connected by power lines and communication links. The system receives power from one or more power sources. Each node contains at least one power port, data port and load port. Associated with each power port and load port is a port monitor for measuring current flowing into or out of the port and the voltage difference between the port outlet and ground, which measurements are passed to a processing element. The processing element and monitor analyze measured values to detect fault conditions. Upon fault condition detection, the port is disabled by opening a switch, disconnecting the port from the system voltage. The processing element receives power directly from the power line, thus receiving power from a live power line even if the associated power port is disabled, allowing the processing element to enable a disabled node following a failure.

DETAILED DESCRIPTION

A power distribution and communication system includes nodes connected by power lines and communication links. The system receives power from one or more power sources. Each node contains at least one power port, data port and load port. Associated with each power port and load port is a port monitor for measuring current flowing into or out of the port and the voltage difference between the port outlet and ground, which measurements are passed to a processing element. The processing element and monitor analyze measured values to detect fault conditions. Upon fault condition detection, the port is disabled by opening a switch, disconnecting the port from the system voltage. The processing element receives power directly from the power line, thus receiving power from a live power line even if the associated power port is disabled, allowing the processing element to enable a disabled node following a failure.

System Overview

Figure 1:
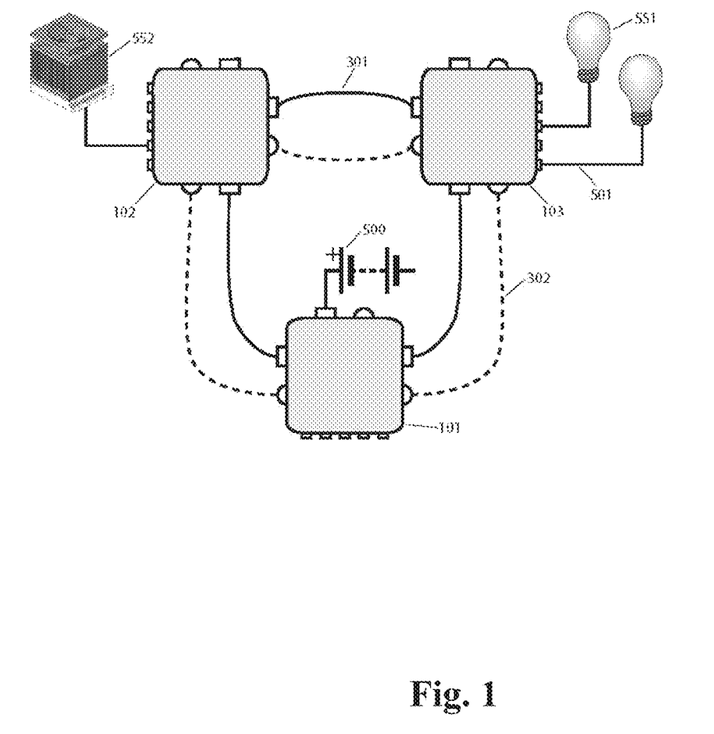
FIG. 1 shows an exemplary combined power distribution and communication system.

FIG. 1 shows an exemplary combined power distribution and communication system according to the invention. In this exemplary configuration, three nodes 101, 102, 103 are connected in a simple loop topology. Power flows bi-directionally between the nodes along power lines 301. A power source, such as a battery 500, provides power to the system via one of the nodes 101. Devices consuming power, for example, two lights 551 and a fan 552 are connected to nodes 102 and 103 by load lines 501. Data passes bidirectionally between the nodes along communication links 302. The data passed on the communication links may be used to enable or disable power sources and devices.

Optionally, the communication links can pass higher level (application-specific) data. For example, they may pass data obtained by a sensor or rate control information for an actuator.

It will be noted that each power and load line shown in FIG. 1 may in fact correspond to a pair of wires if a ground reference wire is to be routed to each node and device, though a single wire may be used if a reliable ground reference, such as a chassis ground, is available to each node and device. Similarly, the communication links shown may represent a pair of wires over which data is transmitted in the form of a voltage differential between the wires. Alternatively, the communication link may constitute optical fiber so as to minimize the likelihood of electromagnetic interference. Thus, the communication network may be based on any one of several well known standards such as RS-485, Ethernet, or CAN-Bus, each of which standards is herein incorporated in its entirety by this reference thereto as if fully set forth herein.

Figure 2:
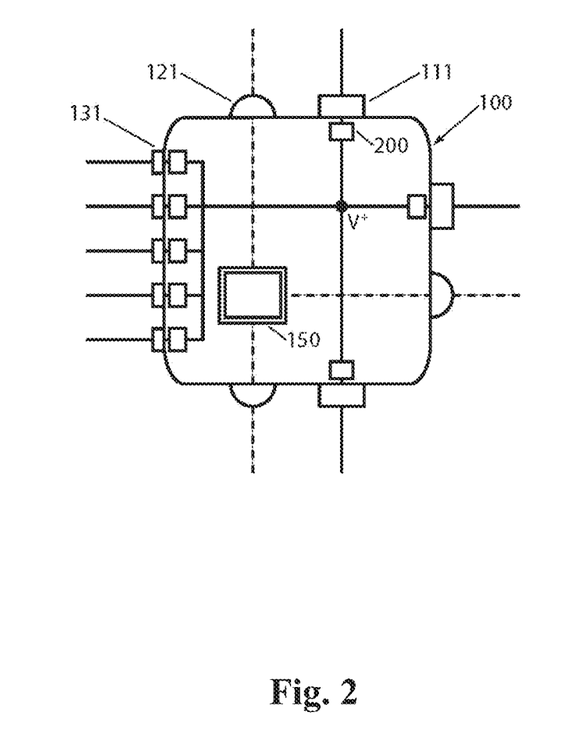
FIG. 2 shows a schematic of a node according to one embodiment.

FIG. 2 shows a schematic of a node according to an embodiment. Each node 100 contains at least one power port 111 and at least one data port 121. In one embodiment, each node also contains at least one load port 131. In the embodiment of FIG. 2, each node contains three power ports, three data ports, and five load ports. As shown in FIG. 1, the power ports and data ports receive the power lines 301 and communication links 302, respectively, connecting the node to other nodes. A power port may alternatively accept power from a power source. The load ports receive load lines connecting power consuming devices to the node. Not all load ports need be utilized at each node; in some cases, such as node 101 in FIG. 1, no load ports are utilized at all. During normal operation, each power port and load port is connected to the system voltage $V^+$, e.g. 42 V.

Associated with each power port and load port is a port monitor 200. The port monitor measures the current flowing in or out of the port. Additionally, the port monitor measures the voltage difference between the port outlet and ground. These measurements are passed to a processing element such as a processor, microcontroller or other integrated circuit having processing capability 150. The processing element and port monitor collectively analyze the measured values to detect one or more fault conditions. If a fault condition is detected, the port is disabled by opening a switch to disconnect the port from the system voltage level. Power is provided to the processing element directly from the power line. That is, the processing element can still receive power from a live power line even if the associated power port is disabled. As described in greater detail below, this allows the processing element to enable a disabled node following a failure.

Voltage and Current Monitoring

Figure 3:
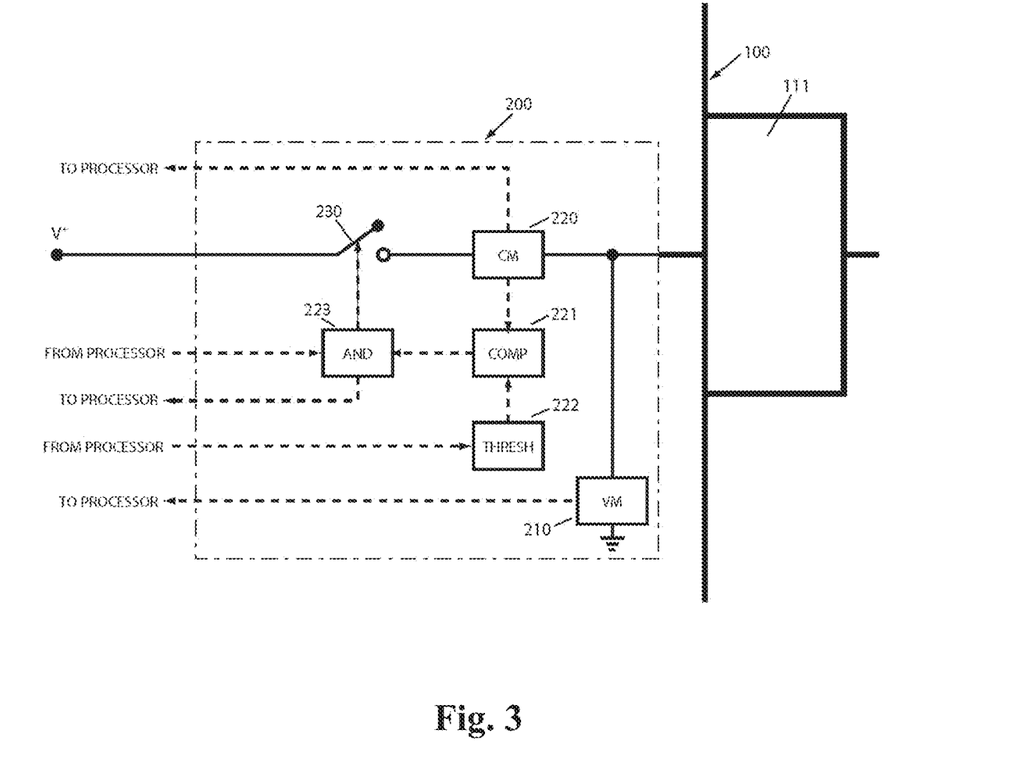
FIG. 3 shows a schematic of a port monitor.

FIG. 3 shows a schematic of a port monitor. Within the monitor is a switch 230, such as a FET (field effect transistor) or other comparable circuit, which is closed under normal operation but, when open, disables the port 111 associated with the port monitor. A voltage monitor 210 measures the difference between the voltage at the port 111 and ground (equal to either zero or $V^+$ under normal operation) to verify the operation of the switch. A current monitor 220 measures the current flowing into or out of the port. A comparator 221 compares the value of the measured current against a threshold value 222 supplied by the processing element. If the associated port is a power port, the comparator considers the absolute value of the measured current, allowing for the bidirectional nature of the current flow between nodes. If the associated port is a load port, the comparator considers the value of the outgoing current. The measured voltage, measured current, and result of the comparison operation are supplied to the processing element for analysis. The switch is controlled by an AND operator 223, such that the switch is closed only upon approval; in other words, positive values; from both the processing element and comparator. The port may thus be disabled either locally (by the comparator) or remotely (by the processing element).

Power Fault Tolerance
Loop Topology (Break)

As shown in FIG. 1, the connectivity of the nodes readily supports configuration in a loop topology. The loop topology provides a fundamental advantage over many conventional power distribution systems in that, should a power line be broken, the bidirectional nature of the power flow ensures that power still reaches all nodes. Additionally, should an intermittent break open in a power line, the voltage drop across the break (potential arc voltage) is a function of the in-line resistance around the loop. Because this resistance is minimal, the potential for in-line arcing is negligible.

Local Port Disablement (Full Short)

If the current monitor measures a current, either into or out of the associated port, that exceeds a threshold value set by the processing element, the comparator sends a zero value to the AND operator to open the switch and disable the port. Thus, if a full short to ground arises in the power line or in a device connected to the associated port, the current monitor detects the resulting increase in current and the port is disabled. Because this disablement occurs locally, the delays and complexity associated with processing element analysis are avoided. The resulting response time is sufficiently rapid to avert damage to any connected devices. In practice, response times as fast as 200 μsec can be attained. If the disabled port is a load port, the other load ports are unaffected. If the disabled port is a power port, power can still reach each all nodes on account of the loop topology described above.

For port monitors associated with load ports, the threshold value 222 may vary in time. In particular, the processing element may supply a threshold allowing an elevated current level for a short period of time following the closure of the switch within the port monitor (and the enabling of the attached device). This ensures that the current monitor will not routinely disable the port for loads, such as incandescent bulbs, that draw a briefly-elevated current (an "in-rush" current) upon closure of the switch. The threshold may be linearly ramped downward from an initially-elevated level or may follow a function that characterizes the activation behavior of the particular device connected to the load port more precisely.

Coordinated Port Disablement (Partial Short)

As noted above and shown in FIG. 3, the current measurements obtained at each port monitor are passed to the processing element within the node. Additionally, as shown in FIG. 2, the processing element 150 is connected to each of the communication links to neighboring nodes. The processing element can thus pass the current measurements to and receive current measurements from neighboring nodes. By comparison of the current exiting one node to the current entering the neighboring node, which quantities are equal under normal operating conditions, a partial short—a high resistance "leak" to ground—can be detected. The processing element can thus detect partial shorts that may not necessarily lead to an increase in current flow sufficient to trigger local port disablement. If such a condition is detected, the processing element disables the port by sending a zero value to the AND operator.

Recovery from Failure

Also provided is a set of procedures for recovering from failures. The recovery procedures may be used independently of or in combination with one another.

In one procedure, after one or more ports have been disabled, each processing element attempts to reestablish the flow of power to and from adjacent nodes by closing the switches within any disabled power ports; which is effected by resetting the input values of the AND operators associated with the switches to '1'. As each switch is closed, the current monitor monitors the current flowing through the port. If the current remains below the threshold specified by the processing element, it is determined that current is not flowing through the power port to ground through a full short, and the switch remains closed. If the current exceeds the threshold, the port is again disabled. A timer operating on the processing element may be used to trigger subsequent attempts at enabling the port, and a counter may be used to limit the number of attempts made. Following successful closure of any disabled power ports, any disabled load ports are enabled in a similar manner, with the current monitors checking for any excessive current draws upon closure of the switches associated with the load ports.

Optionally, upon closure of each switch, the processing element (via the voltage monitor) may compare the voltage differential between the port and ground to the system voltage V+. The voltage differential, in conjunction with the current measured by the current monitor, can be used to detect a high-resistance condition across the switch. If a high-resistance condition, indicative of damage to the switch during the failure, is detected, the switch is opened and the port disabled.

The above procedures are useful for enabling ports disabled in response to unforeseen, transient phenomena that are not actually associated with a failure or in response to true failures that have been repaired by an operator of the system. The procedures provide a relatively simple mechanism for safely restoring full system function when one or more load or power ports have been disabled following such a temporary failure.

Additionally, in recovering from a failure, a processing element may monitor (via the voltage monitor) the voltage at each disabled port. If the processing element detects that the voltage at the port matches the system voltage V+, it infers that the power line leading to the port is healthy, i.e. free of a full short to ground, and accordingly enables the power port. If the timer (described above) used to trigger subsequent attempts at enabling ports is of long duration, this approach can substantially speed the rate of system recovery. It also allows a user to restore power distribution after a temporary failure by manually instructing one node to enable its power ports. Other nodes enable their power ports in response, as the power distribution system heals in an outward fashion.

In other instances, a more persistent failure may not allow for the system to return to full functionality. In these cases, a recovery procedure for restoring as much functionality as possible is provided, given the location of the persistent failure.

When a failure, such as full short to ground, occurs, one or more of the power ports along each pathway between each power source and the failure are disabled. Thus, following the failure, only a fraction of the processing elements within the power distribution system have power—those processing elements in nodes connected to power sources and those processing elements in nodes linked to power sources via power ports that remain enabled.

To recover from the failure, each of the powered processing elements first attempts to enable any disabled load ports. If the load ports are enabled successfully, the processing element attempts to enable any disabled power ports. Initially, the processing element enables each disabled power port with a current threshold just above that needed to power the processing element at any neighboring node connected to the power port. The low current threshold is maintained for a period of time shorter than the expected boot time of the neighboring processing element, after which it is returned to the typical threshold value. If the line leading from the enabled port to the neighboring node is compromised, i.e. it contains the failure, the current threshold is exceeded and the power port is once again disabled. The restart procedure may be attempted again, but a flag or counter within the processing element ensures that the recovery procedure is not attempted continually. If the line leading from the enabled port to the neighboring node is intact, i.e. the failure is elsewhere, the neighboring processing element detects that it has received power on one of its power ports, and, itself, begins the recovery procedure. Similar to the procedure described above, the power distribution system heals outwardly from those nodes with processing elements powered immediately after the failure.

Eventually, a node attempts to enable the port (either a load port or power port) associated with, i.e. directly connected to the line containing, the failure. If the port associated with the failure is a load port, the current threshold is exceeded and the port again disabled. As with the power ports, a flag or counter ensures that the recovery procedure is not attempted continually.

All other load ports and power ports are enabled and system function (apart from the device on the offending load port) is restored. If the port associated with the failure is a power port, the failure draws current in excess of both the temporarily low threshold in the enabling node and the typically higher threshold in the nodes that either remained enabled through failure or have already successfully recovered after failure. However, because the current increases over a finite rise time, the temporarily low threshold is exceeded before the typical threshold. The enabling node disables the power port associated with the failure before any other nodes disable any other power ports. The temporarily-low threshold thus ensures that, upon recovery, the system does not merely return to the system state immediately following the initial failure. Rather, full system function is restored "up to the location of the failure".

Communications Fault Tolerance

The loop topology provides benefits to the communications links similar to those of the power distribution system. Specifically, should a communication link be cut or fully shorted, the bidirectional nature of the data flow ensures that data still reaches all nodes. In monitoring the data received over each data port, the processing element can also provide communications network fault tolerance. For example, if the data received from a neighboring node is zero-valued for an extended period of time, the processing element may infer the presence of a short in the communication link connecting to the neighboring node and disable the corresponding data port. As noted, data can still be received from the neighboring node by traversing the complementary pathway within the loop topology.

Device Diagnostics and Communication Integration

The sharing of data between adjacent nodes also provides an opportunity for system and device diagnostics. One or more nodes within the system can be connected to a separate network and report the location of system failures such as breaks or shorts in power or communications lines.

Such information can save time and effort in remedying a failure. Similarly, the system can report diagnostics for the connected devices. At minimum, the system can detect the failure of a device by monitoring the current drawn by the device. Optionally, the system may be connected to an external network, either onboard or off board the vehicle, e.g. a wireless network, allowing for remote diagnostics of system and device function.

Variations

Alternate Topologies

The example shown in FIG. 1 illustrates one exemplary system design in which each node serves as either a power source, i.e. node 101, or a power sink, i.e. nodes 102 and 103, and the nodes are connected in a single loop topology. The invention is not restricted to such topologies, and indeed the invention provides a great range of flexibility in configuring nodes, power sources, and devices.

For example, it is possible for a single node to be connected to a power source and one or more loads. The network may also contain more than one power source. Additionally, the number and types of ports on each node may vary as well. Generally, nodes have an equal number of communication and power ports. Similarly, the number of power lines and communication links connecting two neighboring nodes is generally the same, with connections serving high-priority devices requiring a higher level of fault tolerance having more than one power line and communication link. However, power and bandwidth requirements may also be considered. For example, a node serving a low-priority device requiring high bandwidth but little power may be connected with several communication links and a single power line. The number of connections between neighboring nodes may also be adjusted in light of the location of the physical pathway between the nodes and the likelihood and nature of any anticipated structural damage.

The system may also be extended by adding connections between nodes to create a limited mesh topology for either power or communication. In this approach, multiple failures may be tolerated depending on the specific mesh topology and the location and number of power sources within the system and the specific communication requirements of the devices within the network. Finally, while each device is generally connected to a load port on a single node, it is possible to connect especially high-priority devices to more than one node to provide additional reliability.

Voltage Monitor Short Detection

Figure 4:
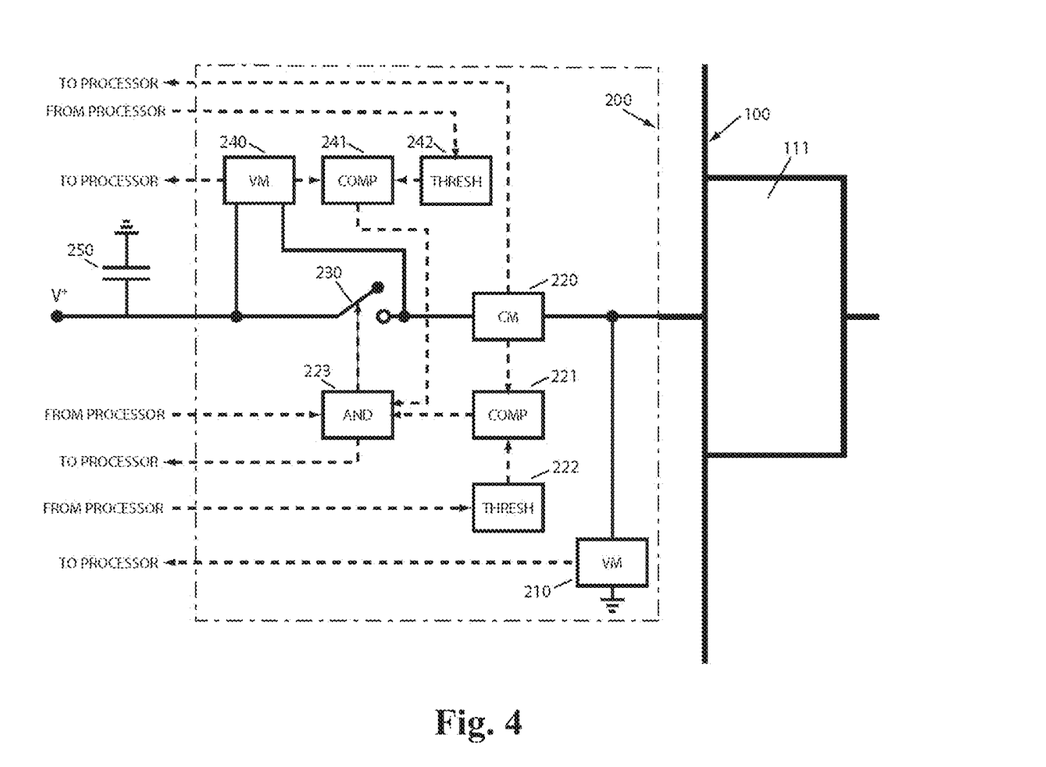
FIG. 4 shows a schematic of a port monitor that incorporates an additional voltage monitor to aid in detecting failures.

FIG. 4 shows a schematic of a port monitor incorporating an additional voltage monitor to aid in detecting failures. The second voltage monitor 240 monitors the voltage differential across the switch 230. A comparator 241 compares the measured voltage to a threshold 242 provided by the processing element. If the measured voltage exceeds the threshold value, the comparator opens the switch and disables the port by sending a zero value to the AND operator.

In the event of a full short to ground, the abnormally high current through the switch will result in a correspondingly large voltage drop across the (small, but non-zero resistance) switch. The second voltage monitor thus provides an alternative to current monitoring in detecting failures and disabling the port in response. While FIG. 4 depicts an embodiment incorporating both a current monitor 220 and a second voltage monitor 240, other embodiments may use the second voltage monitor in place of the current monitor.

As noted above, in embodiments in which the ports are disabled by current monitors, multiple ports may be disabled in response to a single full short to ground. To minimize this effect, an embodiment incorporating a second voltage monitor may also incorporate a capacitor 250 leading from the system voltage $V^+$ to ground. The capacitor serves to momentarily shield the nodes further from the failure from the initial rise in current following the failure. This ensures that the second voltage monitor(s) in port monitors immediately adjacent to the point of failure detect the excessive voltage before those voltage monitors in port monitors further from the point of failure. This greatly reduces the number of ports disabled following a failure—in most system topologies, only two ports are disabled—greatly simplifying and shortening the recovery procedure following failure.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

The invention claimed is:

1. A power distribution system having an integrated communication network, comprising:
   a plurality of nodes, wherein each of the nodes includes:
      a power port and an associated port monitor;
      a load port and an associated port monitor; and
      a processing element;
      wherein the port monitors associated with the power port and the load port are connected to the processing element, and include a current monitor for measuring current flowing into or out of the corresponding port;
   a topology that enables current to flow bi-directionally between the nodes; and
   a communication link for conducting data bi-directionally between the nodes;
   wherein data passed on the communication link is used for any of:
      enabling or disabling any of:
         a power source connected to a particular power port at a corresponding node, or
         a device connected to a particular load port at a corresponding node.

2. The system of claim 1, wherein the processing element corresponding to each of the nodes is configured to:
   send and receive current measurements between the corresponding node and a neighboring node; and
   compare the sent and received current measurements.

3. The system of claim 2, wherein when the sent and received current measurements are equal under normal operating conditions.

4. The system of claim 2, wherein the processing element is configured to detect a partial short condition based on the comparison between the sent and received current measurements.

5. The system of claim 4, wherein the processing element is configured to disable the power port of the corresponding node based on the detected partial short condition.

6. The system of claim 1, wherein each of the port monitors includes:
   a switch for enabling and disabling the corresponding port; and a comparator for comparing the current measured by the current monitor with a threshold value to produce a comparison result.

7. The system of claim 6, wherein the switch is closed only upon approval from both the processing element and the comparator.

8. The system of claim 7, wherein each of the port monitors includes an AND gate, such that the switch is closed only when the approval is input to the AND gate from both the processing element and the comparator.

9. The system of claim 8, wherein the processing element is configured to send a zero value to the AND gate to disable the corresponding port.

10. The system of claim 1, wherein each of the nodes includes a data port, and wherein the communication link is connected between the data ports corresponding to different nodes.

11. A method, comprising:
establishing a power distribution system having an integrated communication network, comprising:
a plurality of nodes, wherein each of the nodes includes:
a power port and an associated port monitor;
a load port and an associated port monitor; and
a processing element;
wherein the port monitors associated with the power port and the load port are connected to the processing element, and include a current monitor for measuring current flowing into or out of the corresponding port;
interconnecting the power ports between the nodes with a topology that enables current to flow bi-directionally between the nodes;
establishing a communication link for conducting data bi-directionally between the nodes; and
passing data on the communication link for any of:
enabling or disabling any of:
a power source connected to a particular power port at a corresponding node, or
a device connected to a particular load port at a corresponding node.

12. The method of claim 11, further comprising:
with the processing element corresponding to each of the nodes:
sending and receiving current measurements between the corresponding node and a neighboring node; and
comparing the sent and received current measurements.

13. The method of claim 12, wherein when the sent and received current measurements are equal under normal operating conditions.

14. The method of claim 12, further comprising:
with the processing element corresponding to each of the nodes:
detecting a partial short condition based on the comparison between the sent and received current measurements.

15. The method of claim 14, further comprising:
with the corresponding processing element, disabling the power port of the corresponding node based on the detected partial short condition.

16. The method of claim 11, wherein each of the port monitors includes:
a switch for enabling and disabling the corresponding port; and
a comparator for comparing the current measured by the current monitor with a threshold value to produce a comparison result.

17. The method of claim 16, wherein the switch is closed only upon approval from both the processing element and the comparator.

18. The method of claim 17, wherein each of the port monitors includes an AND gate, wherein the switch is closed only when the approval is input to the AND gate from both the processing element and the comparator.

19. The method of claim 18, wherein the processing element sends a zero value to the AND gate to disable the corresponding port.

20. The method of claim 11, wherein each of the nodes includes a data port, and wherein the communication link is connected between the data ports corresponding to different nodes.

21. A node for connection to an integrated communication network, the node comprising:
a power port and an associated port monitor;
a load port and an associated port monitor; and
a processing element;
wherein the port monitors associated with the power port and the load port are connected to the processing element, and include a current monitor for measuring current flowing into or out of the corresponding power port or load port;
wherein the node is configured to be interconnected with one or more other nodes within the integrated communication network, including:
a topology that enables current to flow bi-directionally between the node and the other nodes; and
a communication link for conducting data bi-directionally between the node and the other nodes;
wherein data passed on the communication link is used for any of:
enabling or disabling any of:
a power source connected to a particular power port at a corresponding node, or
a device connected to a particular load port at a corresponding node.

22. The node of claim 21, wherein the processing element is configured to:
send and receive current measurements between the node and a neighboring one of the other nodes; and
compare the sent and received current measurements.

23. The node of claim 22, wherein when the sent and received current measurements are equal under normal operating conditions.

24. The node of claim 22, wherein the processing element is configured to detect a partial short condition based on the comparison between the sent and received current measurements.

25. The node of claim 24, wherein the processing element is configured to disable the power port based on the detected partial short condition.

26. The node of claim 21, wherein each of the port monitors includes:
a switch for enabling and disabling its corresponding port; and
a comparator for comparing the measured current measured by the current monitor with a threshold value to produce a comparison result.

27. The node of claim 26, wherein the switch is closed only upon approval from both the processing element and the comparator.

28. The node of claim 27, wherein each of the port monitors includes an AND gate, wherein the switch is closed only when the approval is input to the AND gate from both the processing element and the comparator.

29. The node of claim 28, wherein the processing element is configured to send a zero value to the AND gate to disable the corresponding port.

30. The node of claim 21, further comprising:
a data port, and wherein the communication link is connected between the data port and a corresponding data port at one of the other nodes.

* * * * *